(12) United States Patent
Ito et al.

(10) Patent No.: US 12,087,706 B2
(45) Date of Patent: Sep. 10, 2024

(54) SEMICONDUCTOR DEVICE INCLUDING GROOVE IN TERMINATION REGION

(71) Applicant: Mitsubishi Electric Corporation, Tokyo (JP)

(72) Inventors: Takaki Ito, Tokyo (JP); Tsuyoshi Osaga, Tokyo (JP); Kota Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 446 days.

(21) Appl. No.: 15/734,477

(22) PCT Filed: Nov. 19, 2018

(86) PCT No.: PCT/JP2018/042708
§ 371 (c)(1),
(2) Date: Dec. 2, 2020

(87) PCT Pub. No.: WO2020/105097
PCT Pub. Date: May 28, 2020

(65) Prior Publication Data
US 2021/0233873 A1    Jul. 29, 2021

(51) Int. Cl.
*H01L 23/00* (2006.01)
*H01L 23/31* (2006.01)
(Continued)

(52) U.S. Cl.
CPC ........ *H01L 23/564* (2013.01); *H01L 23/3178* (2013.01); *H01L 29/1608* (2013.01); *H01L 29/404* (2013.01); *H01L 29/0619* (2013.01)

(58) Field of Classification Search
CPC . H01L 23/564; H01L 23/3178; H01L 29/404; H01L 29/1608; H01L 29/0619–0623
See application file for complete search history.

(56) References Cited

U.S. PATENT DOCUMENTS

2009/0160034 A1* 6/2009 Suzuki ............... H01L 29/8613
257/E29.022
2010/0044839 A1   2/2010 Okada et al.
(Continued)

FOREIGN PATENT DOCUMENTS

JP    2009-152457 A    7/2009
JP    2015-220334 A    12/2015
(Continued)

OTHER PUBLICATIONS

International Search Report; Written Opinion; and Notification of Transmittal of the International Search Report and the Written Opinion of the International Searching Authority, or the Declaration issued in PCT/JP2018/042708; mailed Feb. 12, 2019.
(Continued)

*Primary Examiner* — Laura M Menz
*Assistant Examiner* — Candice Chan
(74) *Attorney, Agent, or Firm* — Studebaker & Brackett PC

(57) ABSTRACT

An oxide film (4) is provided on an upper surface of the semiconductor substrate (1). A guard ring (3) is provided on the upper surface of the semiconductor substrate (1). An organic insulating film (6) directly contacts the oxide film (4) in a termination region (7) between the guard ring (3) and an outer edge portion of the semiconductor substrate (1). A groove (8) is provided on the upper surface of the semiconductor substrate (1) in the termination region (7). The groove (8) is embedded with the organic insulating film (6).

9 Claims, 2 Drawing Sheets

(51) Int. Cl.
*H01L 29/16* (2006.01)
*H01L 29/40* (2006.01)
*H01L 29/06* (2006.01)

(56) References Cited

U.S. PATENT DOCUMENTS

| | | | |
|---|---|---|---|
| 2015/0091161 A1 | 4/2015 | Tomita | |
| 2015/0311133 A1* | 10/2015 | Tomita | H01L 23/585 257/487 |
| 2016/0172437 A1* | 6/2016 | Masuda | H01L 29/0619 257/494 |
| 2016/0315157 A1* | 10/2016 | Onogi | H01L 29/7802 |
| 2017/0110545 A1 | 4/2017 | Nagao et al. | |
| 2018/0138272 A1 | 5/2018 | Ebihara et al. | |
| 2019/0267455 A1* | 8/2019 | Lin | H01L 29/1083 |

FOREIGN PATENT DOCUMENTS

| | | |
|---|---|---|
| WO | 2008/044801 A1 | 4/2008 |
| WO | 2016166808 A1 | 10/2016 |

OTHER PUBLICATIONS

An Office Action; "Notice of Reasons for Refusal", mailed by the Japanese Patent Office on May 10, 2022, which corresponds to Japanese Patent Application No. 2020-557047 and is related to U.S. Appl. No. 15/734,477 with English language translation.

An Office Action; "Notice of Reasons for Refusal," mailed by the Japanese Patent Office on Sep. 20, 2022, which corresponds to Japanese Patent Application No. 2020-557047 and is related to U.S. Appl. No. 15/734,477; with English language translation.

An Office Action mailed by China National Intellectual Property Administration on Nov. 13, 2023, which corresponds to Chinese Patent Application No. 201880099534.0 and is related to U.S. Appl. No. 15/734,477; with English language translation.

* cited by examiner

SEMICONDUCTOR DEVICE INCLUDING GROOVE IN TERMINATION REGION

FIELD

The present disclosure relates to a semiconductor device which needs to have moisture resistance.

BACKGROUND

In a semiconductor device, an oxide film is provided on an upper surface of a semiconductor substrate, and polyimide is provided on the oxide film. However, because of weak adhesion between the oxide film and the polyimide, moisture progresses from an interface of the polyimide and the oxide film in a termination region over time under continuous exposure to high humidity. This causes a problem of electric field concentration between a guard ring at an outermost periphery and a channel stopper. To address this, it has been proposed to extend the termination region to improve moisture resistance (see, for example, PTL 1).

CITATION LIST

Patent Literature

[PTL n] JP 2015-220334 A

SUMMARY

Technical Problem

As a termination region is extended, an effective region through which a current flows becomes narrower and loss characteristics degrade due to increase in current density, leading to a larger chip size. Increase in a chip size is extremely problematic particularly for an expensive material such as a SiC whose chip cost per unit area is extremely high.

An object of the present invention, which has been made to solve the problem as described above, is to provide a semiconductor device which achieves improvement in moisture resistance without making a termination region longer.

Solution to Problem

A semiconductor device according to the present disclosure includes: a semiconductor substrate; an oxide film provided on an upper surface of the semiconductor substrate; a guard ring provided on the upper surface of the semiconductor substrate; and an organic insulating film directly contacting the oxide film in a termination region between the guard ring and an outer edge portion of the semiconductor substrate, wherein a groove is provided on the upper surface of the semiconductor substrate in the termination region, and the groove is embedded with the organic insulating film.

Advantageous Effects of Invention

In the present disclosure, at least one groove is provided on the upper surface of the semiconductor substrate in the termination region. Moisture which intrudes from an edge of the organic insulating film and progresses along the grooves, and thus, a creeping distance for moisture to reach the guard ring at the outermost periphery becomes longer. Additionally, the grooves are embedded with the organic insulating film, and thus, adhesion between the organic insulating film and the oxide film improves. This can prevent progress of moisture from the edge of the organic insulating film, so that it is possible to improve moisture resistance. Further, the termination region can be designed to be shorter, which can lead to a smaller chip size and cost reduction.

DESCRIPTION OF EMBODIMENTS

A semiconductor device according to the embodiments of the present disclosure will be described with reference to the drawings. The same components will be denoted by the same symbols, and the repeated description thereof may be omitted.

Embodiment 1

Figure 1:
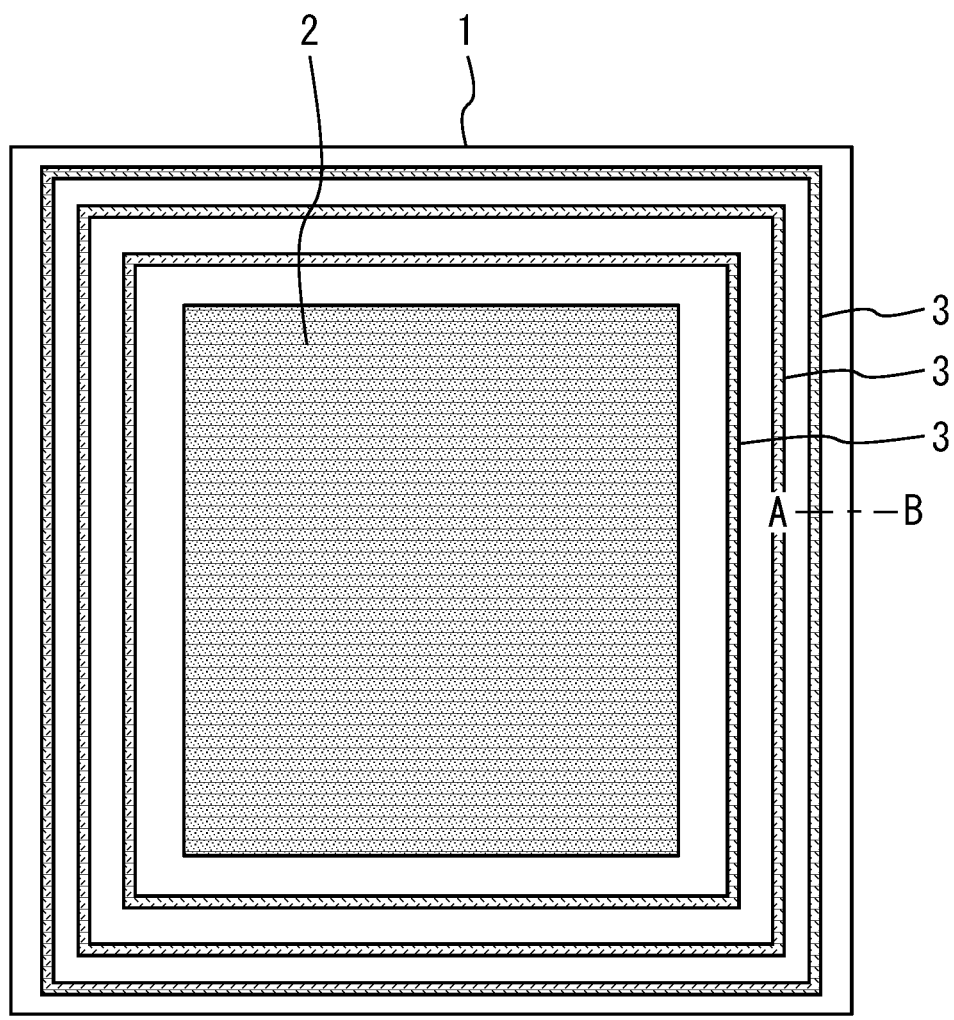
FIG. 1 is a plan view illustrating a semiconductor device according to Embodiment 1.

FIG. 1 is a plan view illustrating a semiconductor device according to Embodiment 1. A central portion of a semiconductor substrate 1 is an effective region 2 through which a current flows. A transistor or a diode is provided in the effective region 2. A plurality of guard rings 3 are provided on an upper surface of the semiconductor substrate 1 so as to surround the effective region 2.

Figure 2:
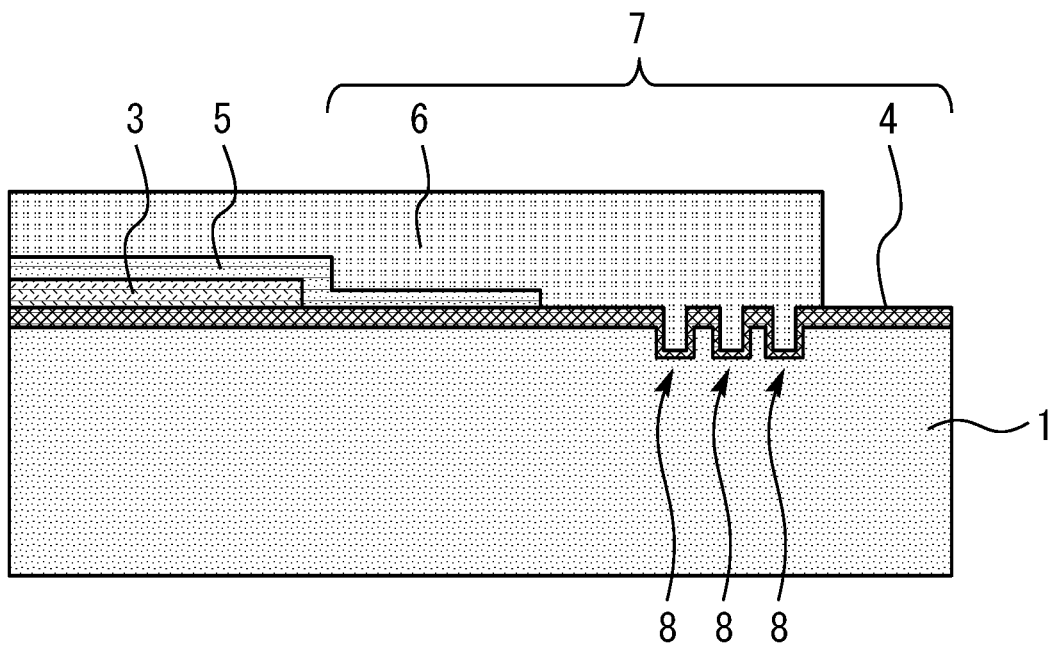
FIG. 2 is a cross-sectional view along the line A-B in FIG. 1.

FIG. 2 is a cross-sectional view along the line A-B in FIG. 1. An oxide film 4 is provided on the upper surface of the semiconductor substrate 1. The semiconductor substrate 1 is a silicon substrate, and the oxide film 4 is a silicon oxide film. The guard rings 3 are selectively provided on the oxide film 4. An insulating protective film 5 is selectively provided so as to cover the guard rings 3. The semiconductor substrate 1 in a wafer state is diced into chips, and the diced portion becomes an outer edge portion of the semiconductor substrate 1.

An organic insulating film 6 is selectively provided on the oxide film 4 and the insulating protective film 5. The organic insulating film 6 is, for example, polyimide. The organic insulating film 6 directly contacts the oxide film 4 in a termination region 7 between the guard ring 3 at the outermost periphery and the outer edge portion of the semiconductor substrate 1. The organic insulating film 6 does not reach the outer edge portion of the semiconductor substrate 1.

In the present embodiment, at least one groove 8 is provided on the upper surface of the semiconductor substrate 1 in the termination region 7. Moisture which intrudes from an edge of the organic insulating film 6 and progresses along the grooves 8, and thus, a creeping distance for moisture to reach the guard ring 3 at the outermost periphery becomes longer. Additionally, the grooves 8 are embedded with the organic insulating film 6, and thus, adhesion between the organic insulating film 6 and the oxide film 4 improves. This can prevent progress of moisture from the edge of the organic insulating film 6, so that it is possible to improve moisture resistance. Further, the termination region 7 can be designed to be shorter, which can lead to a smaller chip size and cost reduction.

Embodiment 2

Figure 3:
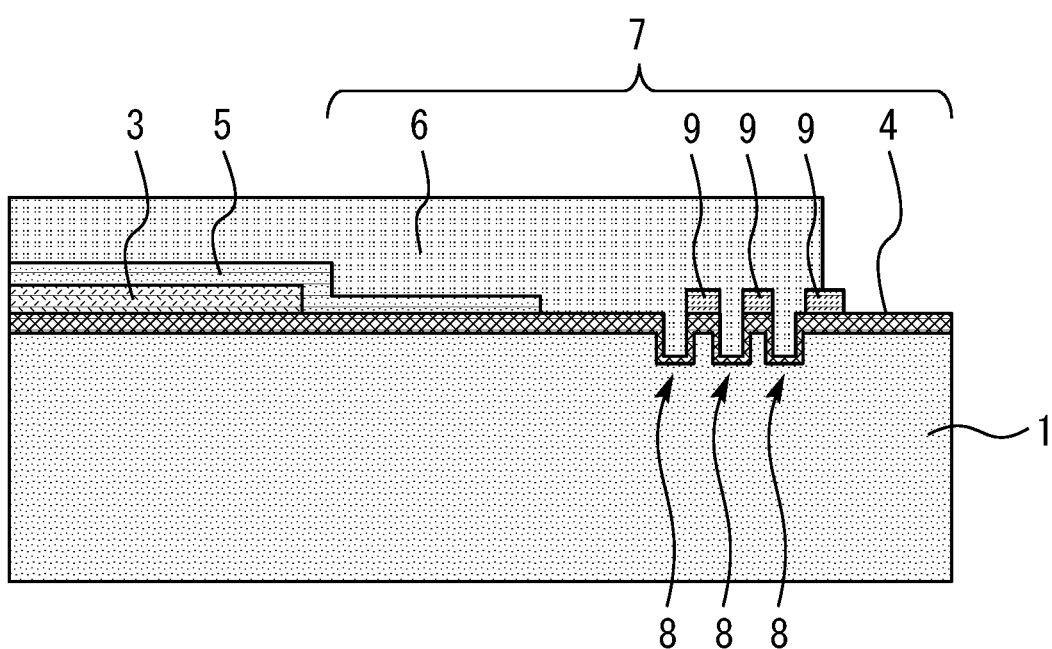
FIG. 3 is a cross-sectional view illustrating a semiconductor device according to Embodiment 2.

FIG. 3 is a cross-sectional view illustrating a semiconductor device according to Embodiment 2. A plurality of adhesion films 9 are selectively provided between the oxide film 4 and the organic insulating film 6 in the termination region 7. Adhesion between the adhesion films 9 and the organic insulating film 6 is higher than adhesion between the organic insulating film 6 and the oxide film 4. Adhesion between the adhesion films 9 and the oxide film 4 is higher than adhesion between the organic insulating film 6 and the oxide film 4. Providing these adhesion films 9 improves adhesion between the organic insulating film 6 and the oxide film 4. Additionally, an interface on which moisture progresses becomes convex by the adhesion films 9, so that a creeping distance for moisture to reach the guard ring 3 at the outermost periphery becomes longer. As a result, it is possible to further improve moisture resistance.

Part of the adhesion films 9 protrude from the organic insulating film 6 toward outside of the semiconductor substrate 1. This increases strength when stress is applied toward outside of the semiconductor substrate 1, so that the adhesion films 9 are less likely to be peeled.

As a result of a plurality of adhesion films 9 being provided, an interface on which moisture progresses becomes concave and convex. Consequently, a creeping distance for moisture to reach the guard ring 3 at the outermost periphery becomes longer, so that it is possible to improve moisture resistance. Thus, the termination region 7 can be designed to be shorter, which can lead to a smaller chip size and cost reduction.

The adhesion films 9 are Tetraethoxysilane (TEOS) films deposited through CVD. A number of concavities and convexities into which polyimide of the organic insulating film 6 can encroach exist on a surface of the TEOS films. Consequently, adhesion between the adhesion films 9 and the organic insulating film 6 becomes higher than that of a thermal oxide film, or the like, with few such concavities and convexities.

Further, the adhesion films 9 are preferably made of SinSiN which is the same material as the insulating protective film 5. This makes it possible to form the adhesion films 9 without adding a process.

The semiconductor substrate 1 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. The present disclosure is particularly effective for a wide bandgap semiconductor device designed to have a high electric field strength at the interface.

A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST 1 semiconductor substrate; 3 guard ring; 4 oxide film; 5 insulating protective film; 6 organic insulating film; 7 termination region; 8 groove; 9 adhesion film

The invention claimed is:

1. A semiconductor device comprising:
    a semiconductor substrate;
    an oxide film provided on an upper surface of the semiconductor substrate;
    a guard ring provided on the upper surface of the semiconductor substrate; and
    an organic insulating film directly contacting the oxide film in a termination region between the guard ring and an outer edge portion of the semiconductor substrate,
    wherein a groove is provided in the upper surface of the semiconductor substrate in the termination region,
    the groove is embedded with the organic insulating film, and
    the oxide film is provided in the groove.

2. The semiconductor device according to claim 1, wherein the organic insulating film is polyimide.

3. The semiconductor device according to claim 1, wherein the semiconductor substrate is made of a wide-band-gap semiconductor.

4. The semiconductor device according to claim 1, wherein the organic insulating film and the guard ring are made of different materials.

5. A semiconductor device comprising:
    a semiconductor substrate;
    an oxide film provided on an upper surface of the semiconductor substrate;
    a guard ring provided on the upper surface of the semiconductor substrate;
    an organic insulating film directly contacting the oxide film in a termination region between the guard ring and an outer edge portion of the semiconductor substrate; and
    an adhesion film provided between the oxide film and the organic insulating film in the termination region, wherein
    a groove is provided in the upper surface of the semiconductor substrate in the termination region,
    the groove is embedded with the organic insulating film,
    adhesion between the adhesion film and the organic insulating film is higher than adhesion between the organic insulating film and the oxide film, and
    adhesion between the adhesion film and the oxide film is higher than adhesion between the organic insulating film and the oxide film.

6. The semiconductor device according to claim 5, wherein part of the adhesion film protrudes from the organic insulating film toward outside of the semiconductor substrate.

7. The semiconductor device according to claim 5, wherein a plurality of the adhesion films are provided.

8. The semiconductor device according to claim 5, wherein the adhesion film is a Tetraethoxysilane film.

9. The semiconductor device according to claim 5, further comprising an insulating protective film covering the guard ring, wherein
    the adhesion film is made of the same material as the insulating protective film.

* * * * *